United States Patent [19]

Tardella et al.

[11] Patent Number: 4,907,042

[45] Date of Patent: Mar. 6, 1990

[54] DEVICE FOR THE MULTIPLICATION OF CHARGE CARRIERS BY AN AVALANCHE PHENOMENON AND APPLICATION OF THE SAID DEVICE TO PHOTOSENSORS, PHOTOCATHODES AND INFRARED VIEWING DEVICES

[75] Inventors: Armand Tardella, Guyancourt; Thierry Weil; Borge Vinter, both of Paris, all of France

[73] Assignee: Thomson-CSF, Paris, France

[21] Appl. No.: 130,647

[22] Filed: Dec. 9, 1987

[30] Foreign Application Priority Data

Dec. 12, 1986 [FR]  France ................................ 86 17406

[51] Int. Cl.[4] .................... H01L 29/205; H01L 27/14; H01L 31/00
[52] U.S. Cl. .......................................... 357/16; 357/4; 357/30; 313/501; 313/542
[58] Field of Search ............... 357/4, 16, 30; 313/542, 313/498, 499, 500, 501

[56] References Cited

U.S. PATENT DOCUMENTS

| | | | |
|---|---|---|---|
| 4,053,920 | 10/1977 | Enstrom | 357/16 |
| 4,170,018 | 10/1979 | Runge | 357/17 |
| 4,208,667 | 6/1980 | Chang | 357/16 |
| 4,383,269 | 5/1983 | Capasso | 357/16 |
| 4,694,318 | 9/1987 | Capasso et al. | 357/16 |
| 4,755,860 | 7/1988 | Allam et al. | 357/4 |

FOREIGN PATENT DOCUMENTS

| | | | |
|---|---|---|---|
| 0023723 | 2/1981 | European Pat. Off. | 357/16 |
| 0162942 | 12/1985 | European Pat. Off. | 357/4 |
| 0230818 | 8/1987 | European Pat. Off. | 357/16 |
| 2261527 | 7/1974 | Fed. Rep. of Germany | 357/4 |
| 2499317 | 8/1982 | France | 357/16 |
| 60-785 | 1/1985 | Japan | 357/4 SL |
| 1038200 | 8/1966 | United Kingdom | 357/16 |

OTHER PUBLICATIONS

Döhler, "Solid State Superlattices", *Sci. Amer.*, Nov. 1983, pp. 144–151.
"New Avalanche Multiplication Phenomenon in Quantum well Super-lattices: Evidence of Impact Ionization Across the band-edge discontinuity", F. Capasso, J. Allam, A. Y. Cho, K. Mohammed, R. J. Malik, A. L. Hutchinson, and D. Sivco, Applied Physics Letter 48 (19) May 12, 1986.
"The Delta-Doped Field-Effect Transistor", Erdmann F. Schubert et al., IEEE Transaction on Electron Devices, vol. ED-33, No. 5, May 1986.
"Preparation and Properties of a New GaAs Sawtooth Doping Superlattice", K. Ploog et al., Sep. 1985.

*Primary Examiner*—Andrew J. James
*Assistant Examiner*—Jerome Jackson, Jr.
*Attorney, Agent, or Firm*—Oblon, Spivak, McClelland, Maier & Neustadt

[57] ABSTRACT

A device for the multiplication of charge carriers of a given type by an avalanche phenomenon includes: a semiconductor material of homogeneous composition, placed in an electrical field.
Perpendicular to the working field, plane and parallel layers which are thin as compared with the thickness of the material separating them, are made in this material and are n-doped or p-doped depending on the type of charge carrier, the said layers forming reservoirs where charge carriers of the said type are confined. The injection of at least one charge carrier of the said type in the charge carrier multiplying device sets off the multiplication of charge carriers through a process of impact ionization. This charge carrier is accelerated by the working field and thus acquires energy sufficient to make it capable of ejecting a charge carrier of the said type from the doped layer. The charge carriers obtained are guided by the working field. This impact ionization process is repeated from one layer to the next, and thus constitutes an avalanche multiplication phenomenon. The device can be applied to photosensors, photocathodes and infrared viewing devices.

8 Claims, 5 Drawing Sheets

FIG_1a
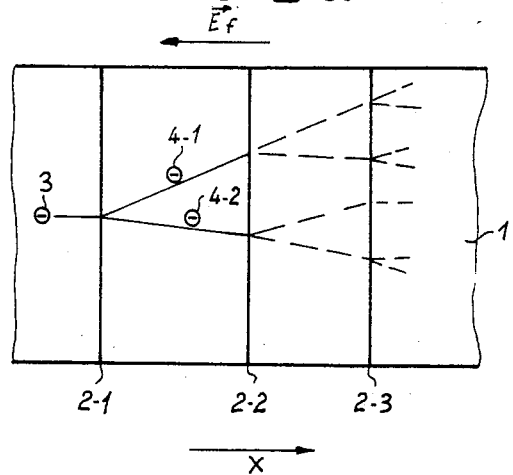
FIG_2a
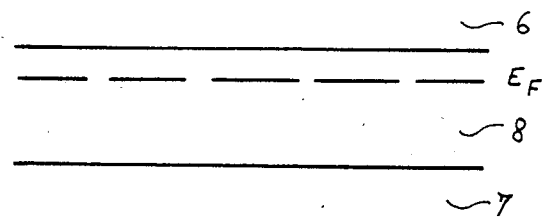
FIG_2b
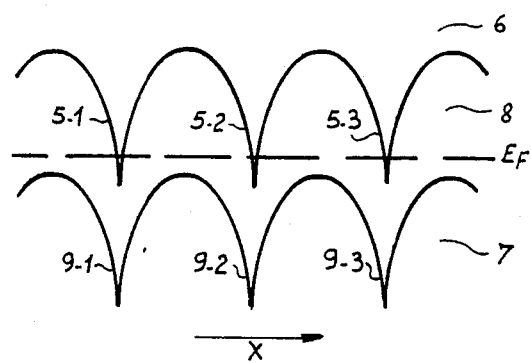

FIG_1b
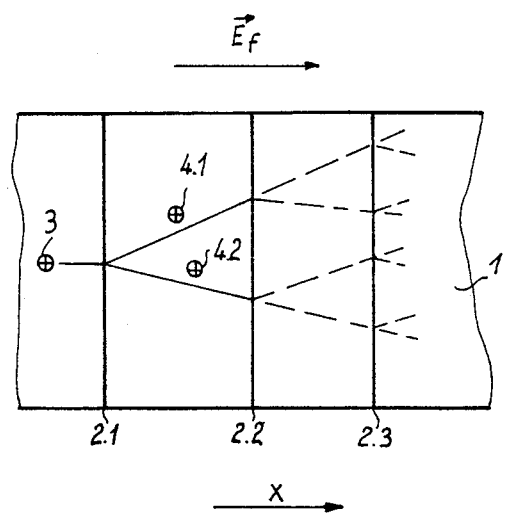
FIG_2c
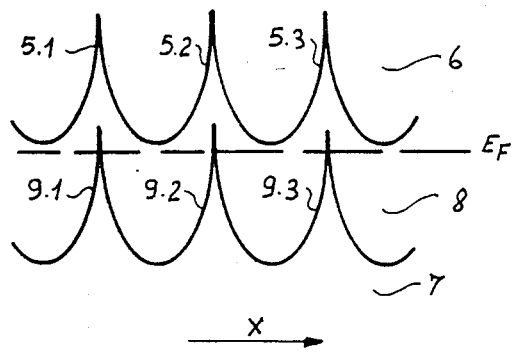

FIG_3a
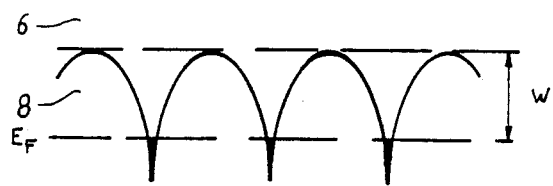
FIG_3b
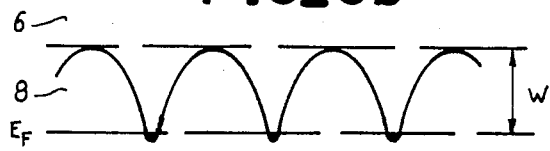
FIG_4a
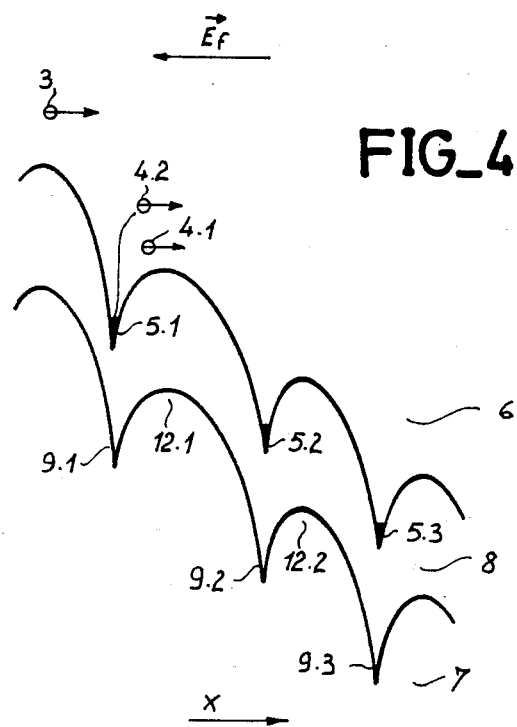

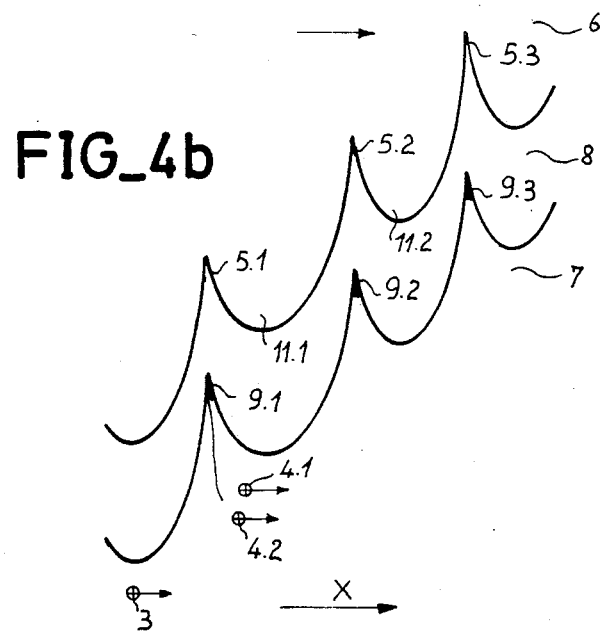
FIG_4b
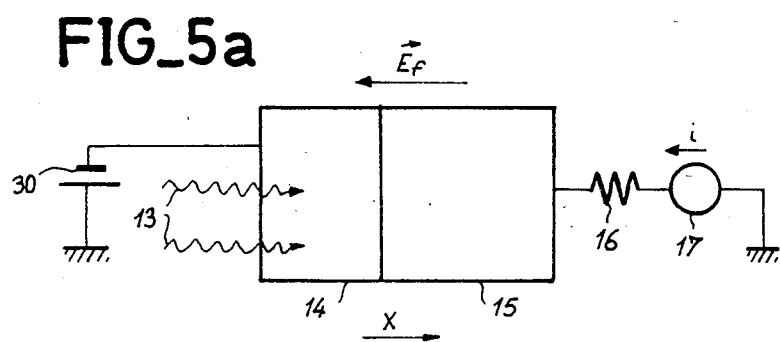
FIG_5a
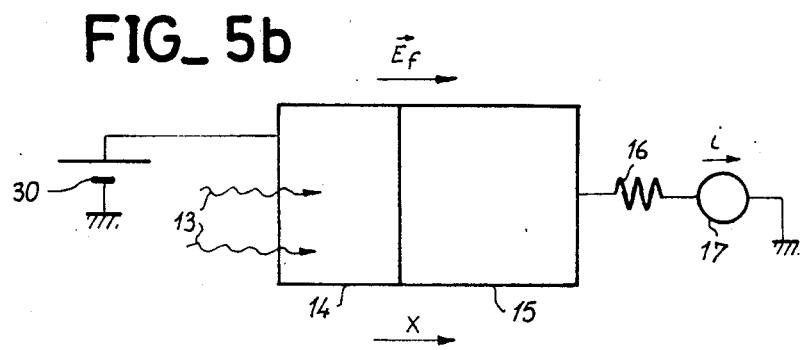
FIG_5b

FIG_6
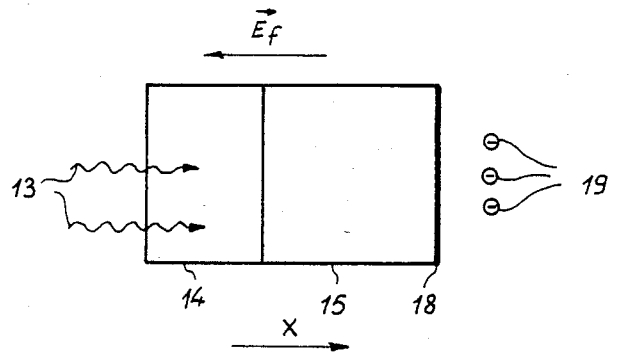
FIG_7a
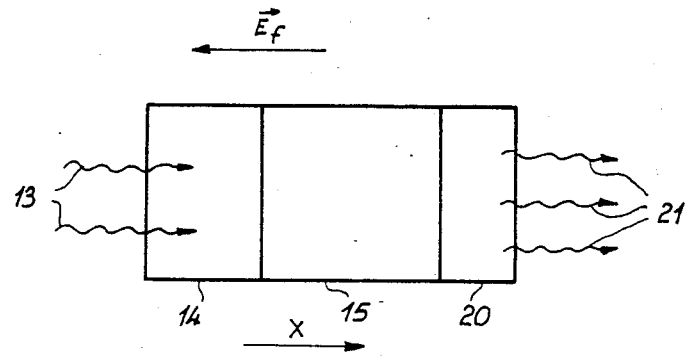
FIG_7b
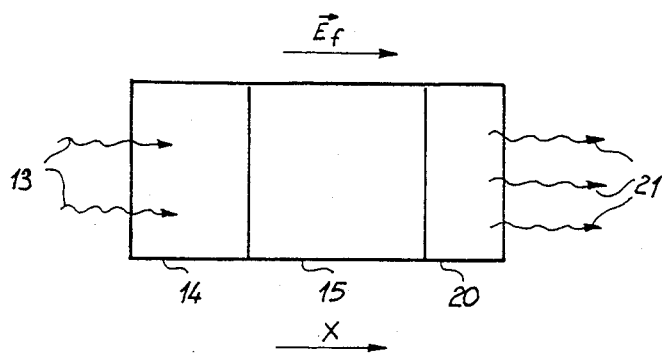

DEVICE FOR THE MULTIPLICATION OF CHARGE CARRIERS BY AN AVALANCHE PHENOMENON AND APPLICATION OF THE SAID DEVICE TO PHOTOSENSORS, PHOTOCATHODES AND INFRARED VIEWING DEVICES

BACKGROUND OF THE INVENTION

1. Field of the Invention

An object of the present invention is a device to multiply low-noise charge carriers of a given type (electrons or holes), where the multiplication occurs by an impact ionization process so that a charge carrier of a given type is capable of releasing one or more charge carriers of the same type by impact, the said charge carriers being capable in turn of releasing additional charge carriers of the said type, thus constituting an avalanche phenomenon.

In a device for the avalanche multiplication of charge carriers, comprising a semiconductor, the noise depends on the ionization ratios of the two types of charge carriers (electrons and holes) present in this semiconductor device, and on the mechanism that sets off the avalanche multiplication process, the ionization ratio of a charge carrier being the probability per unit of length that this charge carrier will undergo an ionizing impact. The noise of the avalanche device is low if the charge carriers to be multiplied have an ionization ratio which is far greater than that of the opposite charge carriers. A second source of noise in a device of this type is related to the dispersal of the number of ionizing impacts per initial charge carrier. This "statistical" noise of the device is reduced if the multiplication of the said charge carriers in the semiconductor takes place not uniformly but, on the contrary, at certain precise positions in the material.

To obtain a good signal-noise ratio in a charge carrier avalanche multiplication device, it is therefore necessary to reduce the two types of noise, described in the above two paragraphs, to the minimum.

2. Description of the Prior Art

There is a device of this type in the prior art. It is described by F. Capasso et al in an article published in Applied Physics, Lett. 48 (19), 12 May 1986, page 1294. This device comprises an electrically semi-conductive material consisting of a succession of substantially parallel heterojunctions between semiconductors of different natures (the term heterojunction refers to a junction between two different materials or between materials of different compositions). These heterojunctions introduce discontinuities forming square potential wells into the band structure of the said material and in a direction substantially perpendicular to the said heterojunctions. These wells constitute reservoirs in which charge carriers of a given type are trapped. This material is placed in an electric field, called the working field, which is applied in a direction substantially perpendicular to the said heterojunctions. The multiplication of the charge carriers of the said type is set off by the injection of at least one charge carrier of the same type. This charge carrier is accelerated by the working field and thus acquires sufficient energy for it to be capable, through impact ionizing, of ejecting a charge carrier of the said type out of the potential well where it is confined. The charge carriers of the said type are guided by the working field. This ejection process is repeated from one potential well to the next and constitutes an avalanche multiplication process. Unfortunately, the crystalline growth of heterostructures of this type is extremely difficult to achieve: on the one hand, it calls for precise control over a great many parameters and, on the other hand, it is difficult to make "clean" interfaces, namely interfaces that are clearly defined in terms of crystallography.

Furthermore, the potential wells obtained in the band structure of a material of this type are shallow. There is therefore a high probability that a charge carrier will possess sufficient thermal energy to spontaneously leave the potential well where it is trapped. Consequently, this device possesses high thermal noise.

An object of the present invention is a charge carrier multiplying device (hereinafter called CCMD) based on the same working principle as the prior art device described in the previous paragraph but comprising an electrically semi-conductive material consisting of a single semiconductor of homogeneous composition in which substantially parallel layers are made, the said layers being n-doped or p-doped depending on the type of charge carriers which it is sought to multiply. For the CCMD of the present invention can multiply:

Either electrons, in which case it is an electron multiplying device (hereinafter called EMD);

Or holes, in which case, it is a hole multiplying device (hereinafter called HMD).

These layers are separated by portions of the said electrically semi-conductive material and the thicknesses of the said layers are far smaller than the dimensions of the said portions in a direction substantially perpendicular to the said layers.

The crystalline growth of a single homogeneous-composition semiconductor of this type, containing substantially parallel doped layers, is far less difficult to achieve than the growth of a heterostructure such as that of the prior art, for there is a far smaller number of parameters to be monitored.

Consequently, a single semiconductor of this type containing doped layers is far easier to manufacture on an industrial scale than a heterostructure of the type described previously.

Furthermore, the doping of a single semiconductor of this type makes it possible to obtain far deeper potential wells than the square potential wells obtained with the heterojunctions of the heterostructure described above. The CCMD of the present invention has a much lower level of thermal noise than the device of the prior art.

SUMMARY OF THE INVENTION

More particularly, the invention pertains to a device for the multiplication of charge carriers of a given type by means of an avalanche phenomenon, the said device comprising:

an electrically semi-conductive material;

in this material, substantially parallel layers introducing potential wells in a direction which is substantially perpendicular to the said layers, the said wells forming reservoirs in which the charge carriers of the said type are confined;

means for the application of an electric field, called a working field, in the direction substantially perpendicular to the said layers;

the injection of at least one charge carrier of the said type, this carrier being accelerated by the working field and being capable of producing, through a process of impact ionization, the ejection of a charge carrier of the same type out of a potential well, the charge carriers of the said type being guided by the working field, the said ejection process being repeated from one potential well to the next and thus constituting an avalanche multiplication process;

device wherein, the electrically semi-conductive material is a single semiconductor of homogeneous composition;

the said layers are n-doped or p-doped semiconductor zones depending on the type of charge carrier;

the said layers are separated by portions of the said electrically non-conductive material, the thicknesses of the said layers being far smaller than the dimensions of the said portions in a direction substantially perpendicular to the layers.

BRIEF DESCRIPTION OF THE DRAWINGS

Improvements, embodiments as well as other advantages and specific features of the invention will appear in the following description made with reference to the following figures, of which:

FIG. 1a illustrates the principle of the invention in the case of electron multiplication;

FIG. 1b illustrates the principle of the invention in the case of hole multiplication;

FIG. 2a represents the band structure of a semiconductor material;

FIG. 2b represents the band structure of the semiconductor material forming an EMD according to the invention when the material is not placed in an electric field;

FIG. 2c represents the band structure of the semiconductor material forming an HMD according to the invention when the material is not placed in an electric field;

FIG. 3a represents potential wells introduced into the band structures of a semiconductor material by making monatomic n-doped layers;

FIG. 3b represents potential wells similar to those of FIG. 3a when the n-doped layers comprise several crystalline layers;

FIG. 4a represents the band structure of the semiconductor material forming an EMD according to the invention when this material is placed in an electric field called a working field, and illustrates the working of this EMD;

FIG. 4b represents the band structure of the semiconductor material forming an HMD according to the invention when this material is placed in an electric field called a working field, and illustrates the working of this HMD;

FIG. 5a illustrates the application of an EMD according to the invention to photosensors;

FIG. 5b illustrates the application of an HMD according to the invention to the photosensors;

FIG. 6 illustrates the application of an EMD according to the invention to photocathodes;

FIG. 7b illustrates the application of an EMD according to the invention to infrared viewing devices.

The real scale has not been kept in these various figures and, furthermore, the same reference are repeated for the same elements.

DETAILED DESCRIPTION OF THE INVENTION

An object of the present invention is a charge carrier multiplying device (CCMD) designed to multiply:

Either electrons in which case the device is an EMD;

Or holes in which case the device is an HMD.

FIG. 1a illustrates the electron multiplying process of an EMD. This FIG. 1a shows a sectional view of:

The semiconductor material 1, preferably p-doped in volume;

Made in the material 1, substantially parallel layers 2-1 to 2-3 which are n-doped, preferably highly doped, and constitute electron reservoirs;

An electric field $\vec{E}_f$, called a working field, applied, in a direction X which is substantially perpendicular to the n-doped layers, by means of electrodes placed at each end of the material;

The said section illustrating the electron-multiplying process of the EMD;

The injection of an electron 3 in this structure sets off the electron-multiplying process. This electron 3 is accelerated by the electrical working field $\vec{E}_f$ and thus acquires sufficient energy to be capable of releasing an electron 4-2 from the layer 2-1 by impact. The electrons 4-1 and 4-2 obtained are guided and, in turn, accelerated by the working field $\vec{E}_f$. They are themselves also capable of releasing other electrons from the layer 2-2 by impact. This process is repeated from one layer to the next and constitutes the process of the avalanche multiplication of electrons.

FIG. 1b provides an analogous illustration of the hole-multiplying process of an HMD. This FIG. 1b is a sectional view showing:

The semiconductor material 1, preferably n-doped in volume;

Made in the material 1, substantially parallel layers 2-1 to 2-3 which are p-doped, preferably highly doped, and constitute hole reservoirs;

An electric field $\vec{E}_f$, called a working field, applied in the same way as with the EMD but with the opposite direction;

The said sectional view illustrating the hole-multiplying process of the HMD which is analogous to that of the EMD, with the holes replacing the electrons.

Very precise parallelism between the doped layers 2-1 to 2-3 (n-doped for an EMD and p-doped for an HMD) is not indispensable to the working of the CCMD. However, the crystalline growth of the material 1 is done layer by layer. Consequently, the doped layers made in the material are in fact substantially parallel.

FIG. 2a shows a part of the band structure of a semiconductor material in a given direction. The valence band 7 and the conduction band 6 are separated by a forbidden band 8 at which the Fermi level $E_F$ is located.

FIG. 2b represents a part of the band structure in the direction X of the semiconductor material 1 forming an EMD when the said material is not placed in the working field $\vec{E}_f$. The making of the n-doped layers 2-1 to 2-3 introduces potential wells 9-1 to 9-3 into the valence band 7 and 5-1 to 5-3 into the conduction band 6, the thickness of the layers 2-1 to 2-3 being such that the energy at the bottom of the said wells 5-1 to 5-3 is smaller than the Fermi level $E_F$ of the material, these wells thus forming reservoirs in which electrons are confined.

The distance between the n-doped layers 2-i made in the material is such that two neighbouring potential wells are at a sufficient distance from one another for an electron, confined at the bottom of a well 5-i of the conduction band 6, to have only a very small chance of passing from this well to a neighbouring well by tunnel effect.

In order to optimize the EMD, the regions located between the two neighbouring n-doped layers 2-$i$ are substantially emptied of free charge carriers. For this:

The semi-conductor 1 is p-doped in volume. The free charge carriers located in the said regions are then mainly holes;

The volume concentration in acceptor-type impurities marked $N_a$, corresponding to p-doping by volume, the surface concentration in donor-type impurities marked $N_d$, corresponding to the n-doped of the layers 2-$i$, and the distance between the two successive doped layers 2-$i$ noted L are such that we get:

$$N_d > N_a \times L$$

This condition ensures the disappearance of the holes due to the p-doping by volume of the semi-conductor 1, owing to the electrons contained in the n-doped layers 2-$i$, and this is done without emptying the electron reservoirs which are formed by the potential wells 5-$i$ and physically correspond to the n-doped layers 2-$i$.

Furthermore, the p-doping of the semiconductor 1 brings the Fermi level $E_F$ closer to the top of the valence band 7. To cross the potential barrier separating it from the continuum, an electron confined at the bottom of a well 5-$i$ of the conduction band 6 must therefore acquire energy far greater than its thermal energy. The probability that an electron of this type will spontaneously leave the well in which it is confined is therefore low: in other words, the thermal noise of the EMD is low.

FIG. 2c illustrates an HMD in a manner analogous to the illustration of the EMD of FIG. 2b. The description of FIG. 2c is deduced from that of 2b by permutating the following expressions:

"EMD" and "HMD";
"n-doped" and "p-doped;
"valence band" and "conduction band";
"electrons" and "holes";
"acceptor-type impurities" and "donor-type impurities";
"$N_d$" and "$N_a$", $N_d$ being a volume concentration and $N_a$ being a surface concentration for an HMD;
"top of the valence band 7" and "bottom of the conduction band 6";
"bottom of the said wells 5-1 to 5-3" and "top of the said wells 9-1 to 9-3", "lower than the Fermi level $E_F$" and "higher than the Fermi level $E_F$".

FIGS. 3a and 3b give a schematic view of the potential wells introduced by making n-doped layers within the material constituting an EMD, using the same number of donor-type impurities in two different cases:

FIG. 3a gives a schematic view of the well due to plane doping, i.e. formed by monatomic doped layers;

FIG. 3b gives a schematic view of the same wells when the doped layers comprise a number of (and not only one) crystalline planes. The filling of the potential wells, namely the number of electrons stored in the said wells, is the same in both figures (since the number of donor-type impurities is the same in both cases). Although the shape of the said wells is different in these two cases, the least quantity of energy W (corresponding to the difference in energy between the Fermi level and the edges of the wells) that an electron must acquire to leave the well where it is confined is almost the same in both these cases. The thermal noise is therefore almost non-modified by the number of crystalline planes of the n-doped layers. It is therefore not necessary for the said doped layers to be monatomic.

The description of figures analogous to the FIGS. 3a and 3b, giving a schematic view of the potential wells introduced by the making of p-doped (and not n-doped) layers in the material forming a HMD (and not an EMD) would show that the said layers too do not need to be monatomic.

In practice, a structure of this type can be made in $Al_{1-x} Ga_x As (o<x<1)$ by molecular beam epitaxy.

The making of a structure with semiconductor materials having greater energy gaps (GaP, AlP) would give deeper potential wells and higher ionization energies for the charge carriers trapped in the potential wells, and would therefore further diminish the thermal noise.

The working of an EMD is shown in FIG. 4a. The semiconductive material described in the above description is placed in an electric field $\vec{E}_f$ called a working field. The structure retains an insulating character. This insulating character is shown in FIG. 4a:

The electrons confined in the wells 5-1 to 5-3 of the conduction band 6 cannot conduct electricity because the depth of the wells is far greater than the thermal energy that they can acquire, and the distance between two neighbouring wells is sufficient for the tunnel effect interaction between the potential wells to be negligible;

The holes located at the tops 12-1 and 12-2 of the valence band 7 cannot conduct electricity because the wells of the valence bands 7 constitute barriers to these holes.

By contrast, if a free electron 3 is injected into this structure, the said electron is accelerated by the electrical working field $\vec{E}_f$ and thus acquires energy sufficient for it to be capable of releasing, by impact, an electron 4-2 confined in the well 5-1. The electrons 4-1 and 4-2 obtained are guided and are, in turn, accelerated by the working field $\vec{E}_f$, and they are capable of releasing, by impact, other electrons from the well 5-2. This process of the ejection of electrons outside the potential wells 5-$i$ by impact ionization is repeated from one potential well to the next and constitutes the avalanche multiplication phenomenon shown in FIG. 4a.

The electrons ejected from the potential wells by impact ionization can be replaced in several ways:

Either by the generation of electrons from the valence band;

Or by placing each of the doped layers 2-$i$ in lateral contact with a device capable of giving electrons;

Or again by periodically imposing, for a small period of time, an electric field with a direction opposite to that of the electrical working field $\vec{E}_f$. During this small period of time, the EMD is of course not functional.

The working of an HMD is shown in FIG. 4b. The description of this FIG. 4b is deduced from that of the FIG. 4a by respectively permutating the following expressions:

"Electrons" and "holes";
"Wells 5-$i$ of the conduction band 6" and "wells 9-$i$ of the valence band 7";
"Top 12-$i$ of the valence band 7" and "bottom 11-$i$ of the conduction band 6";
"Valence band" and "conduction band".

Numerous applications can be considered for the CCMD of the invention. Below we shall describe three particular applications.

Firstly, this CCMD can be applied to low-noise photosensors. FIG. 5a illustrates the application of an EMD to photosensors. The problem then lies in detecting photons 13 of a given energy. For this, a junction is made between the EMD 15 and a semiconductor 14 with an energy gap corresponding to the energy of the photons 13 to be detected. This semiconductor 14 is used to inject electrons into the EMD 15. For the photons 13 create electron/hole pairs in the semiconductor 14. The electrons are drawn into the EMD 15 by the working field $\vec{E}_f$. At the outlet of the EMD 15, an electrical current i is detected. For example, this current i flows across a resistor 16 and is measured by an ammeter 17. The voltage source that is used to apply the field $\vec{E}_f$ is marked 30.

The description of FIG. 5b, which illustrates the application of an HMD to photosensors, is deduced from that of FIG. 5a by respectively permutating the following expressions:
 "EMD" and "HMD",
 "Electrons" and "holes";
And by reversing the direction of the working field $\vec{E}_f$ with respect to FIG. 5a.

Secondly, an EMD according to the invention may be applied to low-noise photocathodes, as is shown in FIG. 6. In FIG. 6, the means by which the working field $\vec{E}_f$ is applied are not shown.

The problem then lies in the emitting of free electrons 19 in the vacuum. The injection of electrons into the EMD 15 is obtained, for example, as follows:

A junction is made between the EMD 15 and a semiconductor 14;

on this semiconductor 14 are sent photons 13 with an energy corresponding to the energy gap of the semiconductor 14;

The photons 13 then create electron/hole pairs in the semiconductor 14;

The electrons are drawn into the EMD 15 by the electric working field $\vec{E}_f$, the positive electrode needed to apply this field, located just before the surface 18, is designed so that it has as little effect as possible on the electrons. For example, it comprises:

A very thin (some tens of angstroms) uniform metallic deposit;

A thin metallic lattice;

A highly p-doped semiconductor zone.

The electrons multiplied by the EMD 15 are then ejected into the vacuum through a preliminary processing of the surface 18 of the material forming the EMD 15, for example, by making a deposit of oxygen or caesium on this surface.

Thirdly, the CCMD of the invention can be applied to a device for the conversion/amplification of infrared photons into visible photons, in other words to an infrared viewing device. FIG. 7a illustrates the application of an EMD to infrared viewing devices. The problem here lies in converting few infrared photons 13 into many visible photons 21. The injection of electrons into the EMD 15 is obtained in the same way as above (obviously a semiconductor 14 will be chosen with an energy gap corresponding to the energy of inflated photons). The electrons multiplied by the EMD 15 are converted into visible photons 21 in the following way:

The outlet of the EMD 15 is connected to a semiconductor material 20 which is highly p-doped in volume and has an energy gap corresponding to the energy of visible photons;

The electrons leaving the EMD 15 are recombined then with the holes of the semiconductor 20, emitting visible photons 21.

The description of FIG. 7b, which illustrates the application of an HMD to infrared viewing devices, is deduced from that of FIG. 7a by respectively permutating the expressions:
 "EMD" and "HMD";
 "Electrons" and "holes";
 "p-doped" and "n-doped";
In FIGS. 7a and 7b, the means by which the working field $\vec{E}_f$ is applied are not shown.

These three applications of the CCMD 15 have been described as non-exhaustive examples.

What is claimed is:

1. A device for the multiplication of charge carriers of a given type by means of an avalanche phenomenon, said device comprising:

a first electrically semi-conductive material, said material being a single semiconductor of homogeneous composition;

substantially planar parallel layers provided in said material, said layers having a first conductivity type depending on the type of said charge carriers, said layers being separated by portions of said material, the thicknesses of said layers being far smaller than the thicknesses of said portions, said layers introducing potential wells in a direction substantially perpendicular to said layers, said wells forming reservoirs in which said charge carriers are confined, said portions have a second conductivity type, the number of doping impurities of said layers being greater than the number of doping impurities of said portions;

means for applying a working electric field substantially parallel to said direction; at least one of said charge carrier being injected in said device, being accelerated by said working field and being capable of producing, through a process of impact ionization, the ejection of a charge carrier of said type out of one of said potential wells, said charge carriers being guided by said working field, said ejection process being repeated from said potential well to the next and thus constituting said avalanche phenomenon.

2. Low-noise photosensor comprising:
 a second semi-conductive material with an energy gap corresponding to the energy of the photons to be detected, said photons being absorbed, and thus creating electron/hole pairs;
 a device according to claim 1;
 a junction between said second semi-conductive material and said device enabling the ejection of charge carriers into said device;
 a system for the detection of an electrical current leaving said device.

3. Infrared viewing device comprising:
 a second semi-conductive material with an energy gap such that infrared photons can be absorbed, thus creating electrons/hole pairs;
 a device according to claim 1;
 a junction between said second semi-conductive material and said device, enabling the injection of charge carriers into said device;
 a third semi-conductive material highly p-doped or n-doped, depending on the type of said charge carriers, by volume, with an energy gap corresponding to the energy of visible photons;
 a junction between said device and said third semi-conductive material; enabling the transmission of charge carriers from said device to said third semiconductive material, said charge carriers being recombined with holes or electrons of said third semi-conductive material, thus emitting visible photons.

4. A device according to claim 1, wherein two neighboring said layers are separated by a distance such that tunnel effect interaction between the potential wells is negligible.

5. A device according to claim 1 comprising further means for replacing the charge carriers which are ejected outside said potential wells.

6. A device according to claim 1 wherein:
said charge carriers are electrons;
said layers are n-doped semi-conductor zones;
said portions are p-doped semi-conductor zones in such way that, $N_a$ denoting the volume concentration in p-type impurities of said portions, $N_d$ denoting the surface concentration in n-type impurities of said layers, and L denoting the distance between two successive layers, are such that $$N_d > N_a \times L.$$

7. Low-noise photocathode for ejecting free electrons into a vacuum space comprising: a second semi-conductive material capable of absorbing photons which are capable of creating electron-hole pairs; a device according to claim 6; a junction between said second semi-conductive material and said device enabling the injection of the electrons into said device; a surface capable of providing for the ejection of free electrons into said vacuum space.

8. A device according to claim 1, wherein:
said charge carriers are holes;
said layers are p-doped semi-conductor zones;
said portions are n-doped semi-conductor zones in such way that, $N_d$ denoting the volume concentration in n-type impurities of said portions, $N_a$ denoting the surface concentration in p-type impurities of said layers, and L denoting the distance between two successive layers, are such that:

$$N_a > N_d \times L.$$

* * * * *